(12) United States Patent
Easwaran

(10) Patent No.: US 9,893,757 B2
(45) Date of Patent: Feb. 13, 2018

(54) PULSE-SHAPING LDO PROVIDES FIRST AND SECOND SLEW-RATE INCREASES IN AMPLITUDE

(71) Applicant: TEXAS INSTRUMENTS INCORPORATED, Dallas, TX (US)

(72) Inventor: Sri Navaneethakrishnan Easwaran, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/211,039

(22) Filed: Jul. 15, 2016

(65) Prior Publication Data

US 2017/0237461 A1 Aug. 17, 2017

Related U.S. Application Data

(60) Provisional application No. 62/294,036, filed on Feb. 11, 2016.

(51) Int. Cl.
*H04B 1/38* (2015.01)
*H04B 1/40* (2015.01)
(Continued)

(52) U.S. Cl.
CPC .............. *H04B 1/40* (2013.01); *H03F 1/0227* (2013.01); *H03F 3/193* (2013.01); *H03F 3/245* (2013.01); *H04L 67/12* (2013.01); *H03F 2200/18* (2013.01); *H03F 2200/249* (2013.01); *H03F 2200/451* (2013.01)

(58) Field of Classification Search
CPC .......... H03F 3/211; H03F 3/24; H03F 1/0205; H03F 1/32; H03F 1/0211; H03F 1/02; H03F 1/025; H03F 200/552; H03F 3/189; H03F 3/26; H03F 3/45219; H03F 1/308; H03F 2200/507; H03F 1/301; H03F 1/523

See application file for complete search history.

(56) References Cited

U.S. PATENT DOCUMENTS

| 3,898,571 A | 8/1975 | Caprio |
| 4,896,333 A | 1/1990 | Can |

(Continued)

FOREIGN PATENT DOCUMENTS

| RU | 2103744 C1 | 1/1998 |
| RU | 2277546 C1 | 6/2006 |

(Continued)

OTHER PUBLICATIONS

PCT Search Report for Application No. PCT/US2017/017744, dated Jun. 7, 2017.

*Primary Examiner* — Khanh C Tran
(74) *Attorney, Agent, or Firm* — Lawrence J. Bassuk; Charles A. Brill; Frank D. Cimino

(57) ABSTRACT

One example includes an amplifier system. The amplifier system includes an input stage configured to receive an input pulse signal and to generate a reference voltage pulse based on the input pulse signal. The amplifier system also includes an amplifier stage that receives at least one power voltage and is configured to amplify the reference voltage pulse and to provide pulse-shaping of the amplified reference voltage pulse based on a change of amplitude of the at least one power voltage resulting from an amplitude of the reference voltage pulse.

17 Claims, 4 Drawing Sheets

(51) Int. Cl.
    *H03F 1/02*      (2006.01)
    *H03F 3/24*      (2006.01)
    *H03F 3/193*     (2006.01)
    *H04L 29/08*     (2006.01)

(56) References Cited

U.S. PATENT DOCUMENTS

| | | | |
|---|---|---|---|
| 5,677,647 A | 10/1997 | Knierim | |
| 7,646,244 B1 * | 1/2010 | Hsiao | H03F 1/0266 |
| | | | 330/263 |
| 2006/0133002 A1 * | 6/2006 | Kanoh | H03F 1/52 |
| | | | 361/93.7 |
| 2010/0214024 A1 * | 8/2010 | Jones | H03F 1/0205 |
| | | | 330/310 |
| 2011/0125945 A1 * | 5/2011 | Link | H04L 12/10 |
| | | | 710/110 |
| 2015/0279467 A1 * | 10/2015 | Conte | G11C 16/0408 |
| | | | 365/185.18 |
| 2016/0373062 A1 * | 12/2016 | Mittal | H03F 3/19 |

FOREIGN PATENT DOCUMENTS

| | | |
|---|---|---|
| RU | 2321157 C1 | 3/2008 |
| RU | 2403666 C1 | 11/2010 |
| WO | 2011017176 A1 | 2/2011 |

* cited by examiner

US 9,893,757 B2

PULSE-SHAPING LDO PROVIDES FIRST AND SECOND SLEW-RATE INCREASES IN AMPLITUDE

CROSS-REFERENCE TO RELATED APPLICATION

This application claims the benefit of U.S. Provisional Patent Application No. 62/294,036, filed Feb. 11, 2016, and entitled PSI5 SYNC PULSE SHAPING USING LDO OVERSHOOT METHOD AND TIMING, which is incorporated herein by reference in its entirety.

TECHNICAL FIELD

This disclosure relates generally to electronic systems, and more specifically to a pulse-shaping amplifier system.

BACKGROUND

Amplifiers are implemented in a large variety of electronic circuit applications to provide amplified versions of signals. As one example, amplifiers can be implemented to boost voltages in certain communications standards, such as peripheral sensor interface (PSI) standards (e.g., PSI5). In a synchronous configuration of PSI communication, a transceiver can generate a voltage pulse to trigger peripheral sensors, after which the peripheral sensors can transmit data. The voltage pulse can be generated by the transceiver based on an amplifier to shape the voltage pulse to be compliant to certain timing parameters, such that the data transmission is not corrupted, but also to substantially mitigate radio frequency interference (RFI). As a result, the communication from the peripheral sensors can be provided at the speed that may be required by the standard without being potentially corrupted by RFI.

SUMMARY

One example includes an amplifier system. The amplifier system includes an input stage configured to receive an input pulse signal and to generate a reference voltage pulse based on the input pulse signal. The amplifier system also includes an amplifier stage that receives at least one power voltage and is configured to amplify the reference voltage pulse and to provide pulse-shaping of the amplified reference voltage pulse based on a change of amplitude of the at least one power voltage resulting from an amplitude of the reference voltage pulse.

Another example includes a method for generating a shaped output voltage pulse. The method includes providing an input pulse signal to an input stage to generate a reference voltage pulse based on the input pulse signal. The method also includes providing a first power voltage to an amplifier stage to amplify the reference voltage pulse. The amplifier system includes a first transistor device and a second transistor device interconnected by an output node on which an amplified reference voltage pulse is provided. The method also includes providing a second power voltage to the amplifier stage, the second power voltage having an amplitude that changes in response to a change of resistance associated with a respective one of the first and second transistor devices based on the amplitude of the reference voltage pulse to provide pulse-shaping of the amplified reference voltage pulse on which the shaped output voltage pulse is based.

Another example includes an amplifier system. The system includes an input stage configured to receive an input pulse signal and to generate a reference voltage pulse based on the input pulse signal. The system also includes an amplifier stage. The amplifier stage includes a Class AB amplifier comprising a first transistor device and a second transistor device being interconnected via an output node on which an amplified reference voltage pulse corresponding to the reference voltage pulse is provided. The first and second transistor devices can be arranged between a first power voltage and a second power voltage, respectively. The second power voltage can have an amplitude that changes in response to a change of resistance associated with the second transistor device based on the amplitude of the reference voltage pulse to provide pulse-shaping of the amplified reference voltage pulse.

DETAILED DESCRIPTION

This disclosure relates generally to electronic systems, and more specifically to a pulse-shaping amplifier system. The amplifier system can be implemented in a variety of applications to generate a shaped output voltage pulse in response to an input pulse signal. As an example, the amplifier system can be implemented in a transceiver in a peripheral sensor interface (PSI) system (e.g., PSI5). The amplifier system includes an input stage configured to receive an input pulse signal and to generate a reference voltage pulse based on the input pulse signal. As an example, the input stage can include a pair of switches that are alternately activated via the input pulse signal to charge a capacitor via a reference voltage and to discharge the capacitor to generate the reference voltage pulse. The amplifier system also includes an amplifier stage that can generate an amplified version of the reference voltage pulse, and can provide pulse-shaping of the amplified reference voltage pulse based on an amplitude of the reference voltage pulse.

For example, the amplifier system can include a Class AB amplifier that includes a pair of transistor devices being interconnected via an output node on which the amplified reference voltage pulse corresponding to the reference voltage pulse is provided. As described herein, the term "transistor device" refers to an arrangement of one or more transistors configured to function as a single transistor. The pair of transistor devices can be arranged between a first power voltage and a second power voltage, respectively. For example, the first power voltage can be provided via a charge pump or a boost power converter, and the second power voltage can be provided from a low-dropout (LDO) power supply. The second power voltage can have an amplitude that changes in response to a change of resistance associated with the second transistor device of the pair of transistor devices based on the amplitude of the reference voltage pulse increasing to provide pulse-shaping of the amplified reference voltage pulse. Therefore, the overshoot voltage of the LDO power supply can provide a more gradual increase of the amplified reference voltage pulse for an initial short time duration to substantially mitigate RFI in the generated shaped output voltage pulse.

Figure 1:
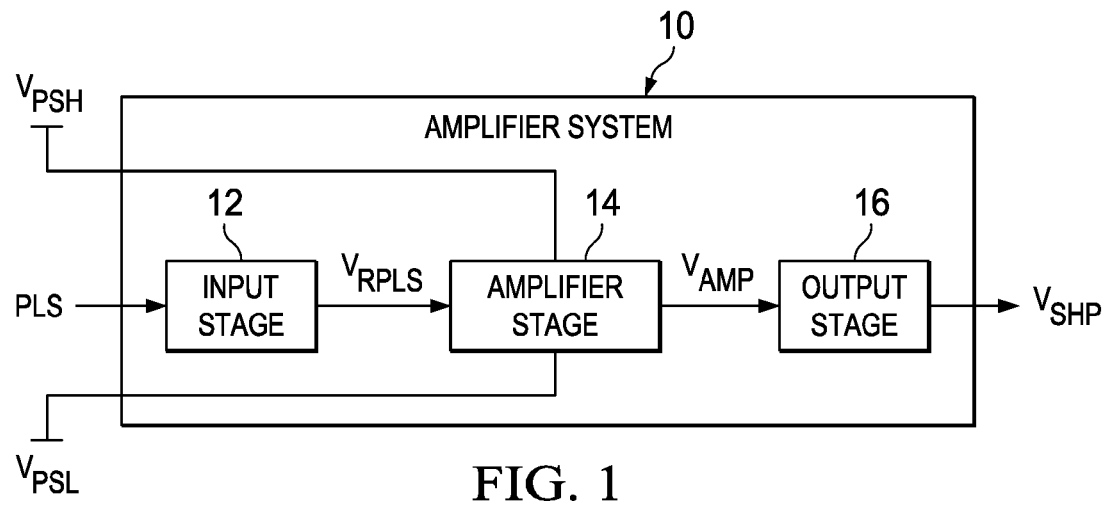
FIG. 1 illustrates an example of an amplifier system.

FIG. 1 illustrates an example of an amplifier system 10. The amplifier system 10 can be implemented in a variety of different implementations to generate a shaped output voltage pulse, demonstrated in the example of FIG. 1 as $V_{SHP}$. For example, as described in greater detail herein, the amplifier system 10 can be implemented in a peripheral sensor interface (PSI) system to generate the shaped output voltage pulse $V_{SHP}$ in a manner to comply with timing requirements of a communication standard while substantially mitigate radio frequency interference (RFI).

The amplifier system 10 includes an input stage 12 that is configured to receive an input pulse signal PLS, such as provided as a low-voltage digital signal to initiate the shaped output voltage pulse $V_{SHP}$, and to generate a reference voltage pulse $V_{RPLS}$ that can be a low-voltage reference pulse that corresponds to the input pulse signal PLS. As an example, the reference voltage pulse $V_{RPLS}$ can be a pulsed voltage signal having a pulse-width that is approximately the same as the pulse signal PLS, and thus can be generated based on the pulse signal PLS. As an example, the input stage 12 can include a pair of switches that are alternately activated via the input pulse signal PLS to charge a capacitor via a reference voltage (e.g., based on a current source) and to discharge the capacitor (e.g., based on a current source) to generate the reference voltage pulse $V_{RPLS}$.

The amplifier system 10 also includes an amplifier stage 14 that is configured to amplify the reference voltage pulse $V_{RPLS}$ to generate an amplified reference voltage pulse $V_{AMP}$. In addition, the amplifier stage 14 is configured to provide pulse-shaping of the amplified reference voltage pulse $V_{AMP}$. As described herein, the term "pulse-shaping" refers to controlling the slew-rate of the amplified reference voltage pulse $V_{AMP}$, and thus controlling at least one of an increase and a decrease of the amplitude of the amplified reference voltage pulse $V_{AMP}$. As an example, the pulse-shaping can be provided at an increase in amplitude of the amplified reference voltage pulse $V_{AMP}$ during a first portion of the increase of the amplitude relative to a second portion of the increase of the amplitude. Therefore, the amplifier stage 14 can be configured to provide a first increase in amplitude of the amplified reference voltage pulse $V_{AMP}$ from a first amplitude to a second amplitude during a first time duration, and to provide a second increase in amplitude of the amplified reference voltage pulse $V_{AMP}$ from the second amplitude to a third amplitude during a second time duration subsequent to the first time duration. The second increase in amplitude of the amplified reference voltage pulse $V_{AMP}$ can be greater than the first increase in amplitude to substantially mitigate RFI associated with the generation of the amplified reference voltage pulse $V_{AMP}$.

In the example of FIG. 1, the amplifier stage 14 is provided a first power voltage $V_{PSH}$ and a second power voltage $V_{PSL}$. As an example, the first power voltage $V_{PSH}$ can be generated via a boost power converter or via a charge pump, and the second power voltage $V_{PSL}$ can be generated via a low-dropout (LDO) power supply. For example, the amplifier stage 14 can include a Class AB amplifier that includes a pair of transistor devices that interconnect the power voltages $V_{PSH}$ and $V_{PSL}$. Thus, in response to an increase in amplitude of the reference voltage pulse $V_{RPLS}$, and thus a change in resistance of the pair of transistor devices, the amplitude of the second power voltage $V_{PSL}$ can increase (e.g., overshoot) to decrease the slew-rate of the amplified reference voltage pulse $V_{AMP}$, and thus to shape the pulse of the amplified reference voltage pulse $V_{AMP}$. As a result, the amplified reference voltage pulse $V_{AMP}$ can have a lower slew-rate for a brief duration of time before the slew-rate of the amplitude of the amplified reference voltage pulse $V_{AMP}$ increases.

The amplifier system 10 further includes an output stage 16 that is configured to provide the shaped output voltage pulse $V_{SHP}$ based on the amplified reference voltage pulse $V_{AMP}$. As an example, the output stage 16 includes a back-to-back transistor device pair through which the amplified reference voltage pulse $V_{AMP}$ can be provided. The back-to-back transistor device pair can be controlled, for example, by an adaptive gate bias system that is configured to set a bias (e.g., provide a gate voltage) of the back-to-back transistor device pair based on an amplitude of the amplified reference voltage pulse $V_{AMP}$. Thus, the back-to-back transistor device pair can be configured to provide the shaped output voltage pulse $V_{SHP}$ at a high current amplitude. While the output stage 16 is demonstrated in the example of FIG. 1 in the amplifier system 10, it is to be understood that it is optional, such that the amplified reference voltage pulse $V_{AMP}$ could instead be provided directly from the amplifier system 10 as the shaped output voltage pulse $V_{SHP}$.

Figure 2:
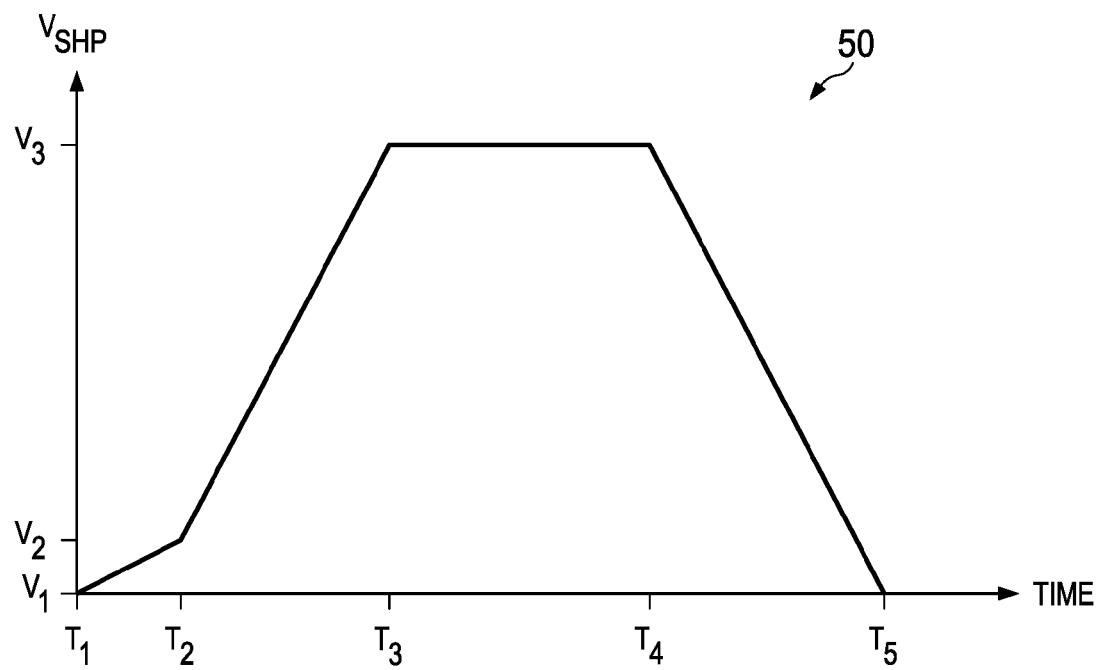
FIG. 2 illustrates an example of a timing diagram.

FIG. 2 illustrates an example of a timing diagram 50. The timing diagram 50 demonstrates the shaped output voltage pulse $V_{SHP}$ plotted over time. The shaped output voltage pulse $V_{SHP}$ can be generated via the amplifier system 10 in the example of FIG. 1. Therefore, reference is to be made to the example of FIG. 1 in the following description of the example of FIG. 2. In the context of the timing diagram 50, while the shaped output voltage pulse $V_{SHP}$ is demonstrated in linearly, it is to be understood that the shaped output voltage pulse $V_{SHP}$ is depicted ideally, such that portions of the actual shaped output voltage pulse $V_{SHP}$ can be non-linear.

The timing diagram 50 can correspond to the shaped output voltage pulse $V_{SHP}$, as shaped via the amplifier stage 14. Beginning at a time $T_1$, the shaped output voltage pulse $V_{SHP}$ can increase from a first amplitude $V_1$ to a second amplitude $V_2$ at a time $T_2$. Thus, the time $T_1$ to the time $T_2$ can define a first duration of time. Beginning at the time $T_2$, the shaped output voltage pulse $V_{SHP}$ can increase from the second amplitude $V_2$ to a third amplitude $V_3$ at a time $T_3$. Thus, the time $T_2$ to the time $T_3$ can define a second duration of time subsequent to the first duration of time. As an example, the third amplitude $V_3$ can correspond to an amplitude that is sufficient for operation of another circuit, such as peripheral sensors in a PSI communication standard (e.g., PSI5). During the first duration of time, the increase of the amplitude of the shaped output voltage pulse $V_{SHP}$ is less than the increase of the amplitude of the shaped output voltage pulse $V_{SHP}$ during the second duration of time. In the example of FIG. 2, the slew-rate of the shaped output voltage pulse $V_{SHP}$ in the first duration of time is less than the slew-rate of the shaped output voltage pulse $V_{SHP}$ in the second duration of time. Therefore, the shaped output voltage pulse $V_{SHP}$ can be pulse-shaped to substantially mitigate RFI by providing a lesser slew-rate in the first duration of time, while complying with communication timing requirements by providing a greater slew-rate in the second duration of time.

As an example, the time $T_1$ can correspond to a time just subsequent to a rising-edge of the pulse signal PLS, such that the reference voltage pulse $V_{RPLS}$ increases to subsequently increase the amplitude of the amplified reference voltage pulse $V_{AMP}$. Therefore, beginning at the time $T_1$, the amplitude of the reference voltage pulse $V_{RPLS}$ can increase to effect a change in the resistance of one of the transistor devices associated with the amplifier stage 14, such that the amplitude of the second power voltage $V_{PSL}$ can provide an overshoot. Thus, the overshoot can cause a decrease in the slew-rate of the amplified reference voltage pulse $V_{AMP}$ during the first time duration. At the time $T_2$, the overshoot can settle (e.g., decrease), thus causing the slew-rate to increase during the second time duration. As a result, the amplified reference voltage pulse $V_{AMP}$ can have a lower slew-rate during the first time duration before the slew-rate of the amplitude of the amplified reference voltage pulse $V_{AMP}$ increases during the second time duration.

Beginning at a time $T_4$, the shaped output voltage pulse $V_{SHP}$ decreases from the third amplitude $V_3$ to the first amplitude $V_1$ at a time $T_5$. As an example, the time $T_4$ can correspond to a time just subsequent to a falling-edge of the pulse signal PLS, such that the reference voltage pulse $V_{RPLS}$ decreases to subsequently decrease the amplitude of the amplified reference voltage pulse $V_{AMP}$. Therefore, beginning at the time $T_4$, the shaped output voltage pulse $V_{SHP}$ decreases (e.g., based on the discharge of a capacitor in the input stage 12). Therefore, the shaped output voltage pulse $V_{SHP}$ can have a pulse-width that is approximately the same as the input pulse signal PLS.

Figure 3:
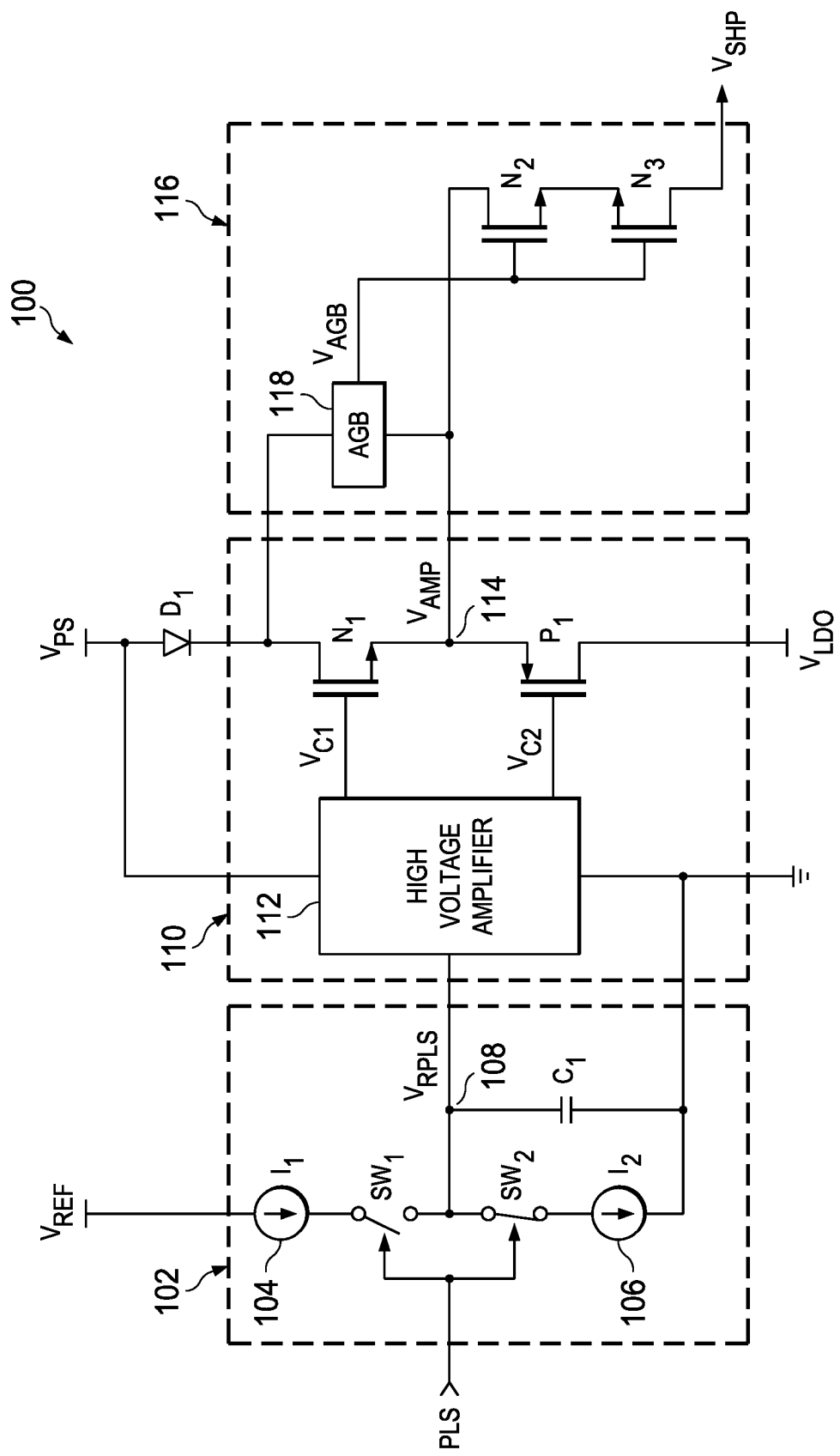
FIG. 3 illustrates an example of a circuit diagram of an amplifier system.

FIG. 3 illustrates an example of a circuit diagram of an amplifier system 100. The amplifier system 100 can correspond to the amplifier system 10 in the example of FIG. 1. Therefore, the amplifier system 100 can be implemented in a variety of different implementations to generate a shaped output voltage pulse, demonstrated in the example of FIG. 3 as $V_{SHP}$. For example, the amplifier system 100 can be implemented in a peripheral sensor interface (PSI) system to generate the shaped output voltage pulse $V_{SHP}$ in a manner to comply with timing requirements of a communication standard while substantially mitigate radio frequency interference (RFI).

The amplifier system 100 includes an input stage 102 that is configured to receive an input pulse signal PLS, such as provided as a digital signal to initiate the shaped output voltage pulse VSHP, and to generate a reference voltage pulse VRPLS at a node 108 that corresponds to the input pulse signal PLS. In the example of FIG. 3, the input stage 102 includes a first current source 104 configured to generate a first current I1 and a second current source 106 configured to generate a second current I2. The first current source 104 is arranged between a reference voltage VREF and a first switch SW1 that is coupled to the node 104 to provide the current I1 to the node 104 in response to the first switch SW1 being closed. Similarly, the second current source 106 is arranged between a second switch SW2 that is coupled to the node 104 and a low voltage rail (e.g., ground) to provide the current I2 from the node 104 in response to the second switch SW2 being closed. In the example of FIG. 3, the first and second switches SW1 and SW2 are alternately activated by the input pulse signal PLS. Additionally, in the example of FIG. 3, the input stage 102 includes an input capacitor C1 that is arranged between the node 104 and the low voltage rail.

Figure 4:
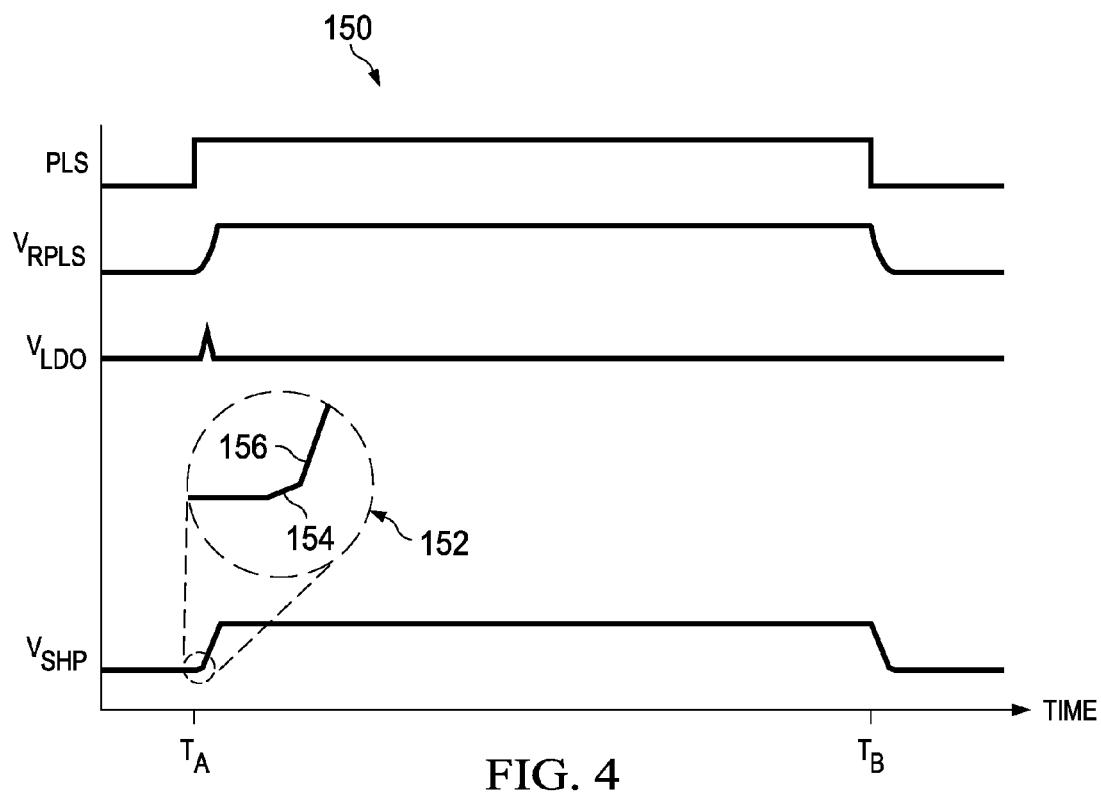
FIG. 4 illustrates another example of a timing diagram.

FIG. 4 illustrates another example of a timing diagram 150. The timing diagram 150 demonstrates the input pulse signal PLS, the reference voltage pulse $V_{RPLS}$, a power supply voltage $V_{LDO}$, and the shaped output pulse signal $V_{SHP}$ plotted as a function of time. At a time $T_A$ (e.g., corresponding to the time $T_1$ in the example of FIG. 2), the input pulse signal PLS transitions from a logic-low state to a logic-high state, and thus has a rising-edge. In response, the first switch SW$_1$ closes and the second switch SW$_2$ opens. As a result, the current I$_1$ charges the capacitor C$_1$ to more slowly increase the amplitude of the reference voltage pulse $V_{RPLS}$ until the reference voltage pulse $V_{RPLS}$ achieves an amplitude of approximately the amplitude of the reference voltage $V_{REF}$.

Referring back to the example of FIG. 3, the amplifier system 100 also includes an amplifier stage 110. The amplifier stage 110 includes a high voltage amplifier 112 that is provided a power supply voltage $V_{PS}$ and is referenced to the low voltage rail (e.g., ground). The amplifier stage 110 also includes an N-type field effect transistor (FET) device N$_1$ and a P-type FET device P$_1$ (hereinafter, "FETs"). The N-FET N$_1$ and the P-FET P$_1$ are arranged as a Class AB amplifier between the power supply voltage $V_{PS}$, via a diode D1, and a power supply voltage $V_{LDO}$. As an example, the power supply voltage $V_{PS}$ can be provided via a boost power converter or via a charge pump, and the second power voltage $V_{LDO}$ can be generated via an LDO power supply. The Class AB amplifier arrangement of the N-FET N$_1$ and the P-FET P$_1$ is configured to generate and pulse-shape an amplified reference voltage pulse $V_{AMP}$ at a node 114 based on the reference pulse voltage $V_{RPLS}$. As an example, the high voltage amplifier 112 is configured to generate a first control voltage $V_{ii}$ and a second control voltage $V_{c2}$ that are level-shifted relative to each other based on the reference voltage pulse $V_{RPLS}$, thus operating the N-FET N$_1$ and the P-FET P$_1$ in a push-pull manner to generate the amplified reference voltage pulse $V_{AMP}$.

As described herein, the power voltage $V_{LDO}$ can provide an overshoot (e.g., an approximate 200 mV increase, such as from 500 mV to 700 mV). As the amplitude of the reference voltage pulse $V_{RPLS}$ begins to increase, the P-FET P$_1$ is still more strongly activated relative to the N-FET N$_1$. Therefore, the amplified reference voltage pulse $V_{AMP}$ increases from a first amplitude (e.g., the amplitude V$_1$ in the example of FIG. 2) to a second amplitude (e.g., the amplitude V$_2$) with the slope of the $V_{LDO}$ overshoot during the first time duration between the times T$_1$ and T$_2$ in the example of FIG. 2 (e.g., approximately 3 μs). Thus, the inclusion of the overshoot of the power voltage $V_{LDO}$ with the amplified reference voltage pulse $V_{AMP}$ ensures a slower ramp rate to mitigate RFI without sacrificing timing. As the slew-rate of the amplified reference voltage pulse $V_{AMP}$ continues to increase, the N-FET N$_1$ activates more strongly than P-FET P$_1$, and the amplitude of the amplified reference voltage pulse $V_{AMP}$ increases (e.g., the amplitude V$_2$ in the example of FIG. 2) to a third amplitude (e.g., the amplitude V$_3$ in the example of FIG. 2, which can be approximately 4 V greater than the amplitude V$_1$) during a second time duration (e.g., from the time T$_2$ to the time T$_3$ in the example of FIG. 2

The amplifier system 100 further includes an output stage 116 that is configured to provide the shaped output voltage pulse $V_{SHP}$ based on the amplified reference voltage pulse $V_{AMP}$. In the example of FIG. 3, the output stage 116 includes an adaptive gate bias system 118, demonstrated as "AGB" 118. The adaptive gate bias system 118 is arranged across the N-FET N$_1$ to adaptively generate a voltage $V_{AGB}$ based on the amplitude of the amplified reference voltage pulse $V_{AMP}$. The output stage 116 also includes an N-FET N$_2$ and an N-FET N$_3$ arranged as a back-to-back transistor device pair through which the amplified reference voltage pulse $V_{AMP}$ is provided as the shaped output voltage pulse $V_{SHP}$. In the example of FIG. 3, the N-FETs N$_2$ and N$_3$ are controlled by the voltage $V_{AGB}$. Thus, the back-to-back transistor device pair of the N-FETs $N_2$ and $N_3$ can provide the shaped output voltage pulse $V_{SHP}$ at a high current amplitude.

Referring again to the example of the timing diagram 150 of the example of FIG. 4, in response to the increase in amplitude of the reference voltage pulse $V_{RPLS}$, the shaped output voltage pulse $V_{SHP}$ begins to increase at a time just subsequent to the time $T_1$. In addition, the resistance ($R_{DS\_ON}$) of the P-FET $P_1$ changes in response to the increase in the control voltage $V_{C2}$ results in a brief overshoot of the power supply voltage $V_{LDO}$ at the time just subsequent to the time $T_1$. As a result, the slew-rate of the amplitude of the amplified reference voltage pulse $V_{AMP}$ decreases momentarily, demonstrated in an exploded view 152 during a brief time duration indicated at 154 corresponding to the time of the overshoot of the power supply voltage $V_{LDO}$. After the overshoot of the power supply voltage $V_{LDO}$ settles (e.g., within approximately 3 µs), the slew-rate of the amplitude of the amplified reference voltage pulse $V_{AMP}$ increases, demonstrated at 156 in the exploded view 152. Accordingly, the amplitude of the shaped output voltage pulse $V_{SHP}$ levels-off (e.g., at an amplitude that is approximately 4 V greater than the voltage $V_1$ in the example of FIG. 2) at a time just subsequent to the time of level-off of the reference voltage pulse $V_{RPLS}$, until a time $T_B$ (e.g., corresponding to the time $T_4$ in the example of FIG. 2).

At the time $T_B$, the input pulse signal PLS transitions from the logic-high state to the logic-low state, and thus has a falling-edge. In response, the first switch $SW_1$ opens and the second switch $SW_2$ closes. As a result, the current $I_2$ discharges the capacitor $C_1$ to slowly decrease the amplitude of the reference voltage pulse $V_{RPLS}$ until the reference voltage pulse $V_{RPLS}$ achieves an amplitude of approximately the voltage $V_1$, which could be approximately zero volts. As a result, at a time just subsequent to the time $T_B$ the shaped output voltage pulse $V_{SHP}$ likewise decreases (e.g., to the amplitude of the power supply voltage $V_{LDO}$).

Accordingly, the lower slew-rate of the amplified reference voltage pulse $V_{AMP}$, and thus the shaped output voltage pulse $V_{SHP}$, during the first time duration at 154 (e.g., during the overshoot) can result in substantially mitigated RFI. Additionally, the more rapid slew-rate of the amplified reference voltage pulse $V_{AMP}$, and thus the shaped output voltage pulse $V_{SHP}$, during the second time duration at 156 (e.g., after the overshoot) can maintain a more rapid increase (e.g., within approximately 3 µs) of the amplified reference voltage pulse $V_{AMP}$, and thus the shaped output voltage pulse $V_{SHP}$, to comply with communication standards (e.g., PSI5). In addition, the topology of the amplifier system 100, as described herein, can be configured to be scalable for any amplitude of the shaped output voltage pulse $V_{SHP}$ based on any delay and/or rise and fall times of the input pulse signal PLS. Furthermore, implementing the overshoot of the power supply voltage $V_{LDO}$ generated via an LDO power supply can allow for an external capacitance of the LDO power supply that is on the order of hundreds of nF, instead of in the tens of µF, which can reduce the physical space of the electronics on an associated board.

Figure 5:
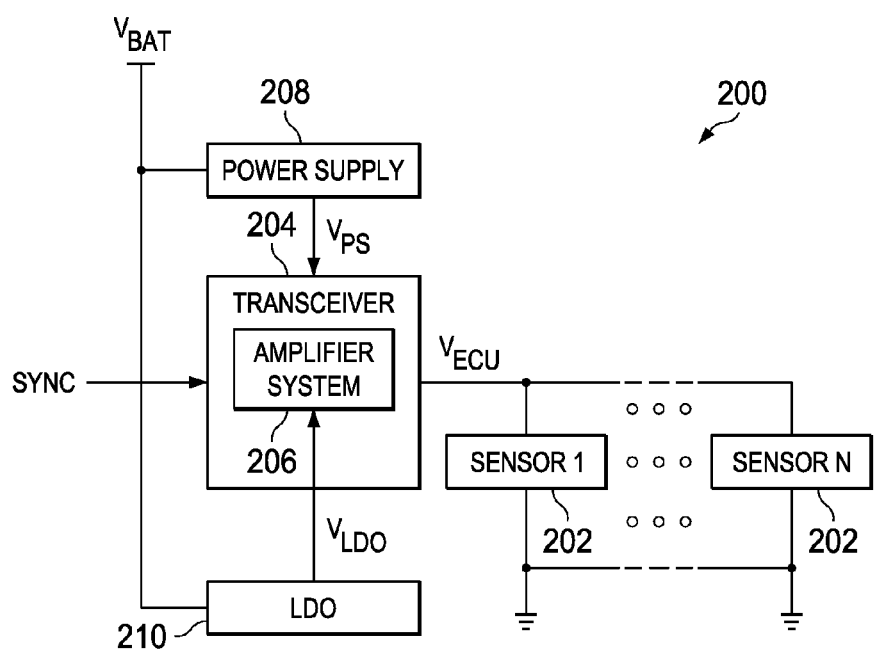
FIG. 5 illustrates an example of a peripheral sensor interface system.

FIG. 5 illustrates an example of a peripheral sensor interface system 200. The peripheral sensor interface system 200 can correspond to any of a variety of systems for controlling peripheral sensors 202, such as in an automotive system. In the example of FIG. 5, the peripheral sensor interface system 200 includes a plurality N of sensors 202, where N is a positive integer, that may be configured to transmit data in response to a shaped voltage pulse $V_{ECU}$ in a time-division multiplexed sequence.

The peripheral sensor interface system 200 also includes a transceiver 204 that is configured to generate the shaped output voltage pulse $V_{ECU}$ in response to a synchronization signal SYNC. As an example, the synchronization signal SYNC can be provided as a pulsed signal, similar to the input pulse signal PLS in the examples of FIGS. 1, 3, and 4. In the example of FIG. 5, the transceiver 204 includes an amplifier system 206, and the transceiver 204 is configured to receive a first power supply voltage $V_{PS}$ from a power supply 208 and a second power supply voltage $V_{LDO}$ from an LDO power supply 210. Each of the power supply 208 and the LDO power supply 210 are configured to receive a battery voltage $V_{BAT}$, such as from an automobile battery. The amplifier system 206 can be configured substantially similarly to the amplifier system 10 in the example of FIG. 1 or the amplifier system 100 in the example of FIG. 3.

As an example, the amplifier system 206 can include an input stage that is configured to receive the synchronization signal SYNC to initiate the shaped output voltage pulse $V_{ECU}$. The amplifier system 206 can also include an amplifier stage that is configured to amplify a reference voltage pulse that is generated based on the synchronization signal SYNC to generate an amplified reference voltage pulse. In addition, the amplifier stage of the amplifier system 206 can be configured to provide pulse-shaping of the amplified reference voltage pulse to generate the shaped output voltage pulse $V_{ECU}$. Therefore, the amplifier stage can be configured to provide a first increase in amplitude of the shaped output voltage pulse $V_{ECU}$ from a first amplitude to a second amplitude during a first time duration, and to provide a second increase in amplitude of the shaped output voltage pulse $V_{ECU}$ from the second amplitude to a third amplitude during a second time duration subsequent to the first time duration. Accordingly, the shaped output voltage pulse $V_{ECU}$ can be generated in a manner that allows the peripheral sensors 202 to operate in a time-division multiplexed manner, and thus to adhere to a communication standard (e.g., PSI5), while substantially mitigating RFI associated with the generation of the shaped output voltage pulse $V_{ECU}$, and thus substantially mitigating corruption of the data transmitted by the peripheral sensors 202.

Figure 6:
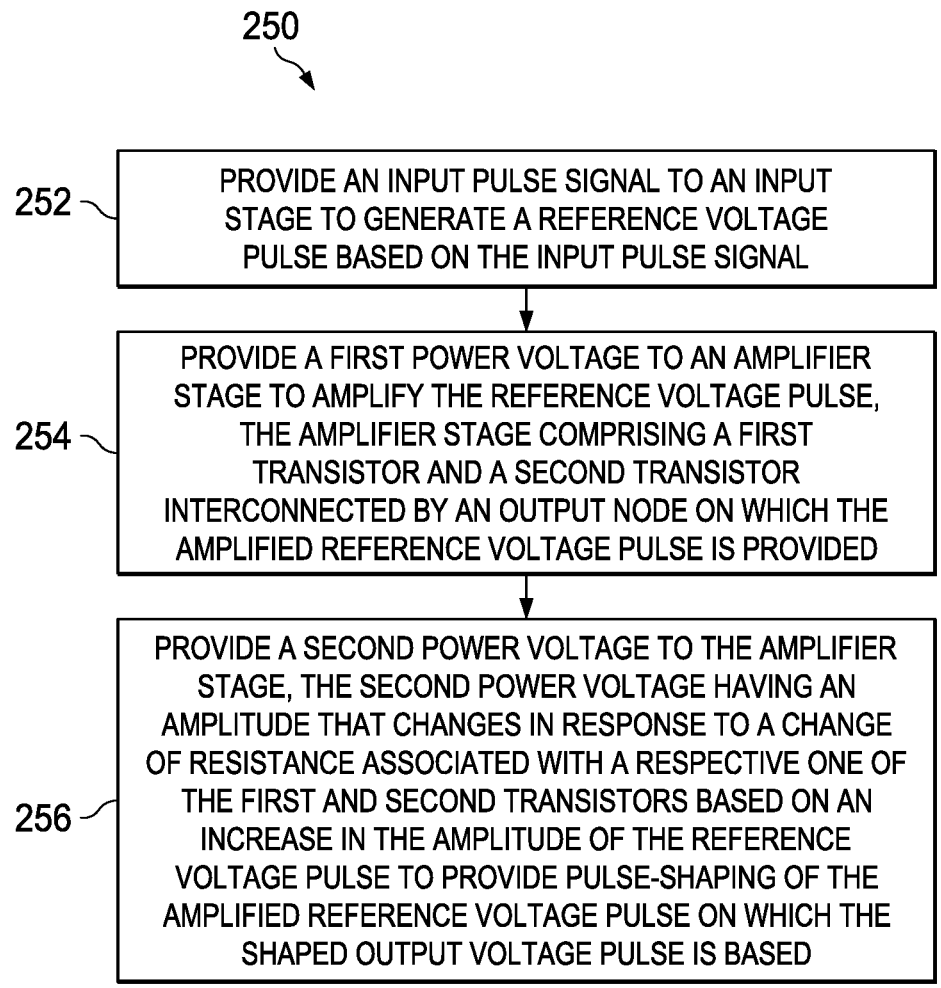
FIG. 6 illustrates an example of a method for generating a shaped output voltage pulse.

In view of the foregoing structural and functional features described above, a method in accordance with various aspects of the present disclosure will be better appreciated with reference to FIG. 6. While, for purposes of simplicity of explanation, the method of FIG. 6 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure.

FIG. 6 illustrates an example of a method 250 for generating a shaped output voltage pulse (e.g., the shaped output voltage pulse $V_{SHP}$). At 252, an input pulse signal (e.g., the input pulse signal PLS) is provided to an input stage (e.g., the input stage 12) to generate a reference voltage pulse (e.g., the reference voltage pulse $V_{RPLS}$) based on the input pulse signal. At 254, a first power voltage (e.g., the power voltage $V_{PSH}$) is provided to an amplifier stage (e.g., the amplifier stage 14) to amplify the reference voltage pulse. The amplifier system can include a first transistor device (e.g., the N-FET $N_1$) and a second transistor device (e.g., the P-FET $P_1$) interconnected by an output node (e.g., the node 114) on which an amplified reference voltage pulse (e.g., the amplified reference voltage pulse $V_{AMP}$) is provided. At 256, a second power voltage (e.g., the power voltage $V_{PSL}$) is provided to the amplifier stage. The second power voltage can have an amplitude that changes in response to a change of resistance associated with a respective one of the first and second transistor devices based on an increase in the amplitude of the reference voltage pulse to provide pulse-shaping of the amplified reference voltage pulse on which the shaped output voltage pulse is based.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. An amplifier system comprising:
    an input stage configured to receive an input pulse signal and to generate a reference voltage pulse based on the input pulse signal; and
    an amplifier stage that receives at least one power voltage and is configured to amplify the reference voltage pulse and to provide pulse-shaping of the amplified reference voltage pulse based on a change of amplitude of the at least one power voltage resulting from an amplitude of the reference voltage pulse, in which the pulse-shaping of the amplified reference voltage pulse provides a first increase in amplitude of the amplified reference voltage pulse from a first amplitude to a second amplitude during a first time duration, and a second increase in amplitude of the amplified reference voltage pulse from the second amplitude to a third amplitude during a second time duration subsequent to the first time duration, the second increase being greater than the first increase.

2. The system of claim 1, in which the amplifier stage includes a Class AB amplifier including a first transistor device and a second transistor device interconnected by an output node on which the amplified reference voltage pulse is provided, in which the amplifier stage is configured to provide the pulse-shaping of the amplified reference voltage pulse based on the change of amplitude of the at least one power voltage resulting from a change of resistance associated with a respective one of the first and second transistor devices based on an increase in the amplitude of the reference voltage pulse.

3. The system of claim 2, in which the at least one power voltage includes:
    a power supply voltage coupled to the output node via the first transistor device; and
    a low-dropout voltage coupled to the output node via the second transistor device, in which the amplifier stage is configured to provide the pulse-shaping of the amplified reference voltage pulse based on an overshoot amplitude of the low-dropout voltage resulting from a change of resistance associated with the second transistor device based on the increase in amplitude of the reference voltage pulse.

4. The system of claim 2, including an output stage, the output stage including:
    a back-to-back transistor device pair interconnecting the output node and an output of the amplifier system and being configured to provide a shaped output voltage pulse corresponding to the amplified reference voltage pulse; and
    an adaptive gate bias system configured to control the back-to-back transistor device pair based on an amplitude of the amplified reference voltage pulse.

5. The system of claim 2, in which the amplifier stage includes a high voltage amplifier configured to control the first transistor device via a first voltage and the second transistor device via a second voltage, wherein each of the first and second voltages are based on the reference voltage pulse.

6. The system of claim 1, in which the input stage includes a pair of switches that are alternately activated via the input pulse signal to charge a capacitor via a reference voltage and to discharge the capacitor to generate the reference voltage pulse.

7. A peripheral sensor interface (PSI) system including a PSI transceiver, the PSI transceiver including the amplifier system of claim 1 to generate the shaped output voltage pulse based on the amplified reference voltage pulse.

8. The PSI system of claim 7, including:
    a first power supply configured to generate a first power voltage of the at least one power voltage; and
    a low-dropout power supply configured to generate a second power voltage of the at least power voltage, the amplifier stage being configured to provide the pulse-shaping of the amplified reference voltage pulse based on a change of amplitude of the second power voltage resulting from an increase in an amplitude of the reference voltage pulse.

9. The PSI system of claim 7, including a plurality of peripheral sensors configured to operate in a time-division multiplex manner in response to the shaped output voltage pulse.

10. A method for generating a shaped output voltage pulse, the method comprising:
    providing an input pulse signal to an input stage to generate a reference voltage pulse based on the input pulse signal;
    providing a first power voltage to an amplifier stage to amplify the reference voltage pulse, the amplifier stage including a first transistor device and a second transistor device interconnected by an output node on which the amplified reference voltage pulse is provided;
    providing a second power voltage to the amplifier stage, the second power voltage having an amplitude that changes in response to a change of resistance associated with a respective one of the first and second transistor devices based on an increase in the amplitude of the reference voltage pulse to provide pulse-shaping of the amplified reference voltage pulse on which the shaped output voltage pulse is based, wherein the pulse-shaping of the amplified reference voltage pulse includes a first increase in amplitude of the amplified reference voltage pulse from a first amplitude to a second amplitude during a first time duration, and a second increase in amplitude of the amplified reference voltage pulse from the second amplitude to a third amplitude during a second time duration subsequent to the first time duration, the second increase being greater than the first increase.

11. The method of claim 10, in which providing the first power supply voltage includes providing the first power supply voltage via one of a charge pump and a boost power converter, and providing the second power supply voltage includes providing the second power supply voltage via a low-dropout power supply.

12. The method of claim 10, in which providing the input pulse signal includes providing the input pulse signal to the input stage including a pair of switches that are alternately activated via the input pulse signal to charge a capacitor via a reference voltage and to discharge the capacitor to generate the reference voltage pulse.

13. The method of claim 10, including activating a plurality of peripheral sensors in a time-division multiplex manner in response to the shaped output voltage pulse according to a peripheral sensor interface (PSI) standard.

14. An amplifier system comprising:
an input stage configured to receive an input pulse signal and to generate a reference voltage pulse based on the input pulse signal; and
an amplifier stage comprising a Class AB amplifier including a first transistor device and a second transistor device interconnected via an output node on which an amplified reference voltage pulse corresponding to the reference voltage pulse is provided, the first and second transistor devices being arranged between a first power voltage and a second power voltage, respectively, the second power voltage having an amplitude that changes in response to a change of resistance associated with the second transistor device based on an increase in the amplitude of the reference voltage pulse to provide pulse-shaping of the amplified reference voltage pulse, in which the pulse-shaping of the amplified reference voltage pulse includes amplified reference voltage pulse from a first amplitude to a second amplitude during a first time duration, and a second increase in amplitude of the amplified reference voltage pulse from the second amplitude to a third amplitude during a second time duration subsequent to the first time duration, the second increase being greater than the first increase.

15. The system of claim 14, including an output stage, the output stage including:
a back-to-back transistor device pair interconnecting the output node and an output of the amplifier system and being configured to provide the shaped output voltage pulse corresponding to the amplified reference voltage pulse; and
an adaptive gate bias system configured to control the back-to-back transistor device pair based on an amplitude of the amplified reference voltage pulse.

16. The system of claim 14, in which the input stage includes a pair of switches that are alternately activated via the input pulse signal to charge a capacitor via a reference voltage and to discharge the capacitor to generate the reference voltage pulse.

17. A peripheral sensor interface (PSI) system including a PSI transceiver, the PSI transceiver including the amplifier system of claim 14 to generate the shaped output voltage pulse based on the amplified reference voltage pulse in response to the input pulse signal to activate a plurality of peripheral sensors in a time-division multiplex manner in response to the shaped output voltage pulse.

* * * * *